United States Patent
Takahashi et al.

(10) Patent No.: US 8,809,091 B2
(45) Date of Patent: Aug. 19, 2014

(54) METHOD OF MANUFACTURING ORGANIC ELECTROLUMINESCENCE ELEMENT

(75) Inventors: Nobuaki Takahashi, Tama (JP); Shigetoshi Kawabe, Hachioji (JP); Natsuki Yamamoto, Kawasaki (JP)

(73) Assignee: Konica Minolta Holdings, Inc., Tokyo (JP)

(*) Notice: Subject to any disclaimer, the term of this patent is extended or adjusted under 35 U.S.C. 154(b) by 0 days.

(21) Appl. No.: 13/514,763

(22) PCT Filed: Oct. 1, 2010

(86) PCT No.: PCT/JP2010/067220
§ 371 (c)(1),
(2), (4) Date: Jun. 8, 2012

(87) PCT Pub. No.: WO2011/070841
PCT Pub. Date: Jun. 16, 2011

(65) Prior Publication Data
US 2012/0252147 A1    Oct. 4, 2012

(30) Foreign Application Priority Data
Dec. 11, 2009    (JP) .................... 2009-281512

(51) Int. Cl.
*H01L 21/00*    (2006.01)

(52) U.S. Cl.
USPC .............. 438/33; 438/22; 438/38; 438/99; 257/E51.005

(58) Field of Classification Search
CPC ............................... H01L 51/50; H01L 51/56
USPC ..................................... 438/22–97
See application file for complete search history.

(56) References Cited

U.S. PATENT DOCUMENTS

| 6,888,172 B2* | 5/2005 | Ghosh ............................. 257/99 |
| 7,858,976 B2* | 12/2010 | Padiyath et al. ................ 257/40 |
| 2003/0152691 A1* | 8/2003 | Baude et al. .................... 427/96 |
| 2005/0095736 A1 | 5/2005 | Padiyath et al. |

(Continued)

FOREIGN PATENT DOCUMENTS

| JP | 2005-135648 A | 5/2005 |
| JP | 2006-084499 A | 3/2006 |

(Continued)

OTHER PUBLICATIONS

International Search Report dated Oct. 26, 2010 issued in International Appln. No. PCT/JP2010/067220 (and English translation thereof).
Japanese Office Action dated Feb. 28, 2014 (and English translation thereof) in counterpart Japanese Application No. 2011-545116.

*Primary Examiner* — Seahvosh Nikmanesh
*Assistant Examiner* — Evren Seven
(74) *Attorney, Agent, or Firm* — Holtz Holtz Goodman & Chick PC

(57) ABSTRACT

A method of manufacturing an organic electroluminescence element having on a belt-formed flexible base material, a first electrode, at least one organic functional layer, and a second electrode, includes continuously forming at least one organic functional layer by coating the same on a first electrode which is formed continuously on the flexible base material in the conveying direction thereof, further forming a second electrode on the organic functional layer, so as to make a plurality of organic electroluminescence element structures in the conveying direction, and then cutting the electroluminescence element structures into individual organic electroluminescence elements so as to manufacture organic electroluminescence elements.

2 Claims, 5 Drawing Sheets

(56) References Cited

U.S. PATENT DOCUMENTS

| | | | |
|---|---|---|---|
| 2005/0129841 A1* | 6/2005 | McCormick et al. | 427/66 |
| 2008/0230777 A1 | 9/2008 | Padiyath et al. | |
| 2009/0186550 A1* | 7/2009 | Foust et al. | 445/3 |
| 2009/0267507 A1* | 10/2009 | Takashima et al. | 313/511 |

FOREIGN PATENT DOCUMENTS

| | | |
|---|---|---|
| JP | 2007-511044 A | 4/2007 |
| JP | 2009-163889 A | 7/2009 |
| JP | 2009-164032 A | 7/2009 |
| WO | WO2006/100889 A1 | 9/2006 |

\* cited by examiner

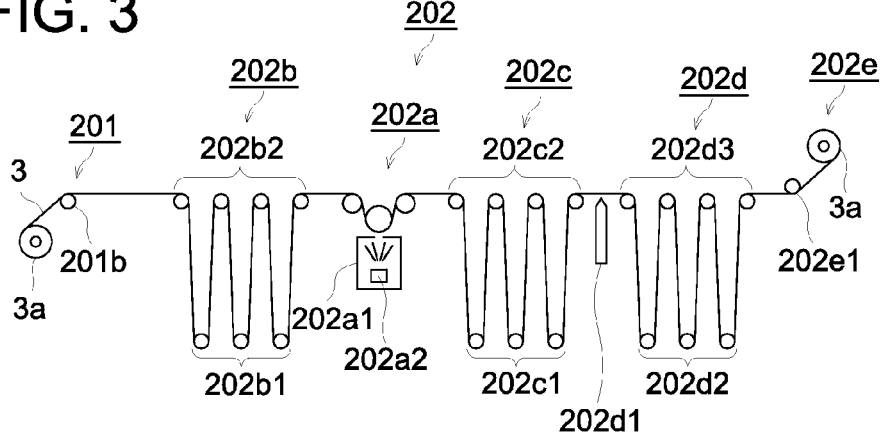
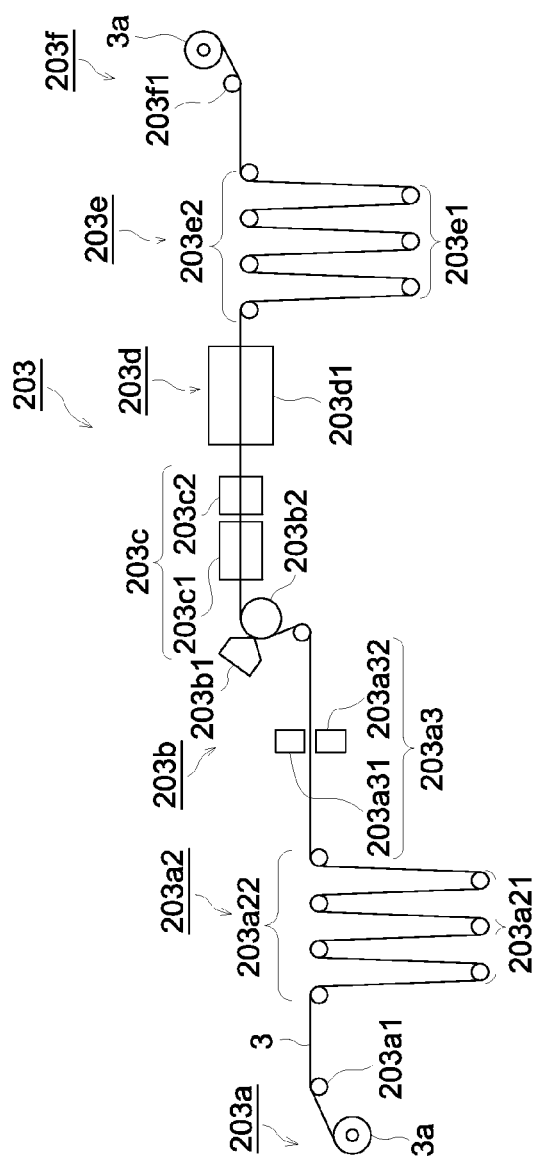

METHOD OF MANUFACTURING ORGANIC ELECTROLUMINESCENCE ELEMENT

This application is a U.S. National Phase Application under 35 USC 371 of International Application PCT/JP2010/067220 filed Oct. 1, 2010.

TECHNICAL FIELD

The present invention relates to a producing method of an organic electroluminescence element which is produced with a roll-to-roll production method.

BACKGROUND

In recent years, application of an organic EL element (an organic electroluminescent element) to a display device such as a flat display and to a light source for an electrophotographic copier and a printer has been investigated. This organic EL element is constituted by providing a first electrode (anode) made of a transparent conductive layer such as ITO (indium tin oxide) on a transparent substrate such as a glass substrate, and by further providing thereon with an organic functional layer including a light emitting layer, and a second electrode (cathode) made of, for example, aluminum in that order. On the circumference of the organic EL element, there are arranged a first electrode (anode) side pickup electrode and a second electrode (cathode) side pickup electrode for connecting the first electrode (anode) and the second electrode (cathode) to an outer circuit or to an internal drive circuit.

It is known that light emission is induced by recombination of an electron with a hole in the organic functional layer when voltage is applied on the EL element to inject an electron from the second electrode (cathode) and a hole from the first electrode (anode), respectively.

An organic EL element is a light emitting element of an electric current drive type which is composed of a very thin organic compound layer (an organic functional layer) including a fluorescent or a phosphorescent light emitting layer sandwiched between a first electrode (anode) and a second electrode (cathode), and emits light by applying an electric current to it. Generally, an organic substance is an insulator, however, it is possible to inject an electric current by making the thickness of the organic layer to be very thin. Further, since an organic EL element can be driven at a voltage as low as 10V or less, and since it is possible to produce light emission with high efficiency, it attracts attention used for a display or a lighting of the future.

As a formation way of a very thin film of an organic compound used for an organic EL element, there are known a dry process method and a wet process method (it is also called a wet coating method).

In the dry process method, a thin film is formed under a high vacuum condition by performing vapor-deposition, for example. In this case, although it excels vey much from the viewpoints of efficiency and quality since it is easy to make a laminated layer structure, on the other hand, vapor-deposition is performed under a high vacuum condition such as $10^{-4}$ Pa or less, therefore, the process is complicated and the const becomes high. As a result, it is not necessarily desirable from a viewpoint of production.

On the contrary, in the wet process, there can be adopted various wet processes such as an extrusion coating method, a dip coating method, an ink-jet method, and a printing method. That is, there is an advantage of a low cost because manufacturing under atmospheric pressure is possible. That is, there is an advantage of a low cost because manufacturing under atmospheric pressure is possible. Further, there are advantages of bare generation of unevenness even for a large area since a solution is prepared to make thin film. Therefore, this is a method for forming a thin film currently used to a large extent from the viewpoint of that there is a large merit of cost and manufacturing technology. This can be said a large merit with respect to a cost and a manufacturing technology particularly in illumination application of an organic EL element.

As a production method of an organic EL element, there are known a sheet method which uses a sheet form substrate, and a roll-to-roll method which uses a belt form flexible substrate. However, there is a limit of raising manufacturing efficiency by a sheet method, and since a roll-to-roll method has high potentiality to increase manufacturing efficiency, it is investigated a roll-to-roll method combined with a wet process.

The following method is known: plural first electrodes are formed on a belt form flexible substrate with a roll-to-roll method, then, on these first electrodes are successively applied in a pattern with a hole transport layer forming coating solution, and a light emitting layer forming coating solution with a wet coating method such as an ink-jet method to form a hole transport layer and a light emitting layer (for example. Refer to Patent document 1). However, it is difficult to increase manufacturing efficiency with this method, it will induce nonuniformity of the coating thickness called dry nonuniformity.

The following production method is known as a way of producing an organic electroluminescence panel having a uniform thickness without a defect of dry nonuniformity and with increased manufacturing efficiency by a roll-to-roll method. In this method, an organic functional layer forming coating solution is coated on a continuously conveyed belt form flexible substrate formed thereon a first electrode in a patterned form by using a wet coating mode to coat on the whole surface such as a die coating method (for example, refer to Patent document 2). However, by this method, when the coating solution for forming an organic functional layer is coated to the whole surface by a wet coating method, there will be produced coating unevenness of the organic functional layer induced by the presence of a step difference at a space between one first electrode and an adjacent first electrode since the first electrode is patterned, ant this will result in luminescence nonuniformity. This phenomenon will be easily generated especially at the peripheral area of an electrode.

PRIOR ART DOCUMENTS

Patent Documents

Patent document 1: WO 06/100889
Patent document 2: JP-A No. 2009-164032

SUMMARY OF THE INVENTION

Problems to be Solved by the Invention

Unlike the conventional film forming way, in a method of producing an organic EL element which forms an organic functional layer having a small wet coating thickness by using a low viscosity coating solution, it is easy to be influenced by a step difference. It has been found out that there would be generated a coating unevenness caused by unstable coating thickness resulted from the step difference on the gap of the first electrodes.

The causes of unevenness/step difference of the gap portion of the first electrodes are as follows.

(1) Unevenness caused by presence or absence of a step difference of the first electrodes themselves (2) Unevenness caused by increment of the edge portion generated during the patterning of the first electrodes (increase of unevenness by the step difference)

(3) Unevenness caused by a difference in shrinkage at presence or absence of the first electrodes when the substrate for forming the first electrodes is subjected to heat treatment (after the formation of the first electrodes, there are many occasions to carry out heat treatment for drying the substrate or coated film after coating, and it will cause to increase the unevenness of the substrate).

Consequently, an object of the present invention is to resolve the above-described problems, and an object of the present invention is to provide a method for producing an organic EL element comprising a belt form flexible substrate having thereon a first electrode, organic functional layers including at least one light emitting layer, a second electrode and a sealing member by a roll-to-roll method with high production efficiency while keeping stable performance quality.

Means to Solve the Problems

An object of the present invention described above has been achieved by the following constitutions.

1. A method for producing an organic EL element comprising a belt form flexible substrate having thereon a first electrode, at least one organic functional layer and a second electrode, the method comprising the steps of:

continuously forming the at least one organic functional layer with a coating method on the first electrode which has been continuously provided on the belt form flexible substrate in a conveying direction of the belt form flexible substrate;

further forming the second electrode on the formed organic functional layer to produce a structure having a plurality of organic EL elements arranged in the conveying direction of the belt form flexible substrate; then cutting the plurality of organic EL elements to separate into each of the organic EL elements.

2. The method for producing an organic EL element described in the aforesaid item 1, after completing the continuously forming step of the organic functional layer with a coating method, further comprising the following step of:

processing the first electrode located between the structure having the plurality of organic EL elements to result in making the first electrode to have a discontinuous portion.

3. The method for producing an organic EL element described in the aforesaid item 1, the continuously forming step of the at least one organic functional layer with a coating method is done after completing the following step of:

processing a predetermined portion of the first electrode to result in making the first electrode to have a discontinuous portion with a gap of 0.5 mm to 2 mm.

Effects of the Invention

According to the present invention, it is possible to provide a method for producing an organic EL element comprising a belt form flexible substrate having thereon a first electrode, organic functional layers including at least one light emitting layer and a second electrode by a roll-to-roll method with high production efficiency while keeping stable performance quality.

BRIEF DESCRIPTION OF THE DRAWINGS

FIG. 1 is a schematic drawing to show an example of an organic EL element relating to the present invention.

FIG. 3 is a schematic drawing to show from the supplying step till a first electrode forming step illustrated in FIG. 2.

FIG. 4 is a schematic drawing to show a hole transfer layer forming step illustrated in FIG. 2.

EMBODIMENTS TO CARRY OUT THE INVENTION

Hereafter, the preferred embodiments to carry out the present invention will be described in details, however, the present invention is not limited to them.

Figure 1A:
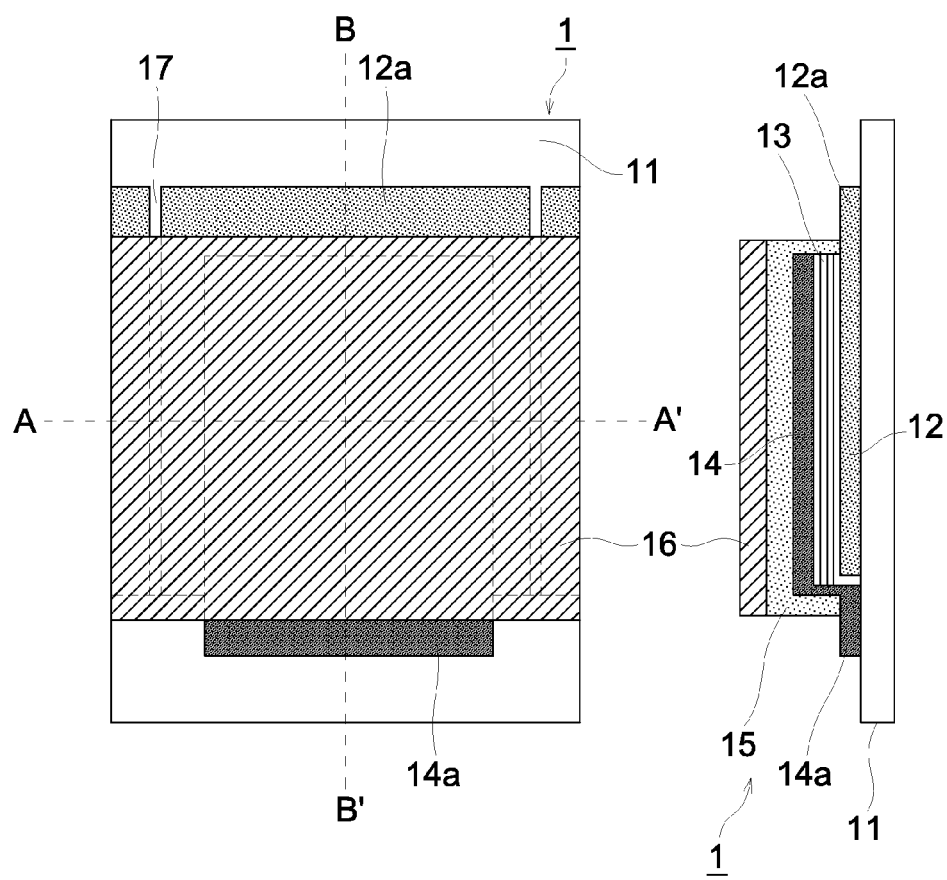
FIG. 1(a) is a plan view of the organic EL element.
Figure 1C:
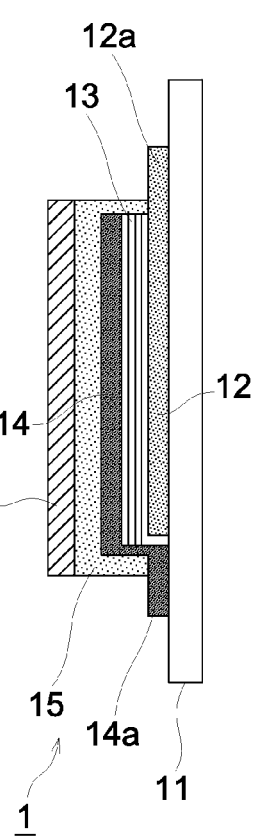
FIG. 1(c) is a B-B' cross-sectional view of the organic EL element.
Figure 1B:
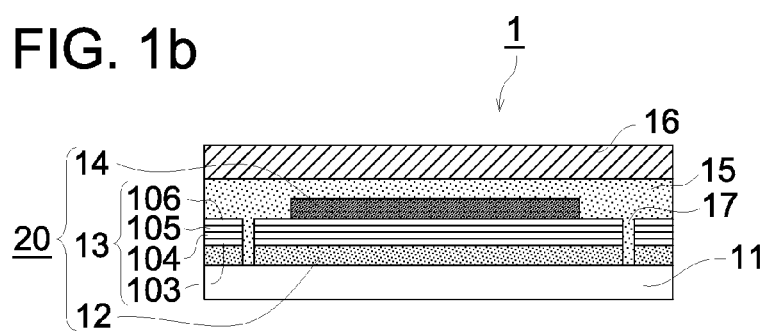
FIG. 1(b) is an A-A' cross-sectional view of the organic EL element.

FIG. 1 is a schematic drawing to show a constitution of an organic EL element. FIG. 1(a) is a plan view of an organic EL element 1, FIG. 1(b) is an A-A' cross-sectional view of the organic EL element 1 and FIG. 1(c) is a B-B' cross-sectional view of the organic EL element 1. As illustrated in FIG. 1(b), the organic EL element 1 has the following constitution: on a flexible substrate 11 are formed a first electrode 12, organic functional layers 13 and a second electrode 14 to make an organic EL structure 20; further on the upper surface of the organic EL structure 20 is laminated with a sealing member 16 through a sealing agent 15. The organic functional layers 13 are composed of a plurality of organic layers such as a hole transport layer 103, a light emitting layer 104, an electron transport layer 105 and a cathode buffer layer (electron injection layer) 106. Further, as illustrated in FIG. 1(b), an organic EL structure 20 is covered with the sealing member 16 on the upper surface including the organic functional layers 13. The upper portion of the sealing member 16 in the figure is exposed a portion of the first electrode 12, and the under portion of the sealing member 16 in the figure is exposed a portion of the second electrode 14. By supplying electric current to the upper portion and the under portion of the sealing member 16 in the figure, the organic functional layers 13 emit light. The portion of the first electrode 12 which is exposed at the upper portion of the sealing member 16 is called as a first electrode take out portion 12a, and similarly, the portion of the second electrode 14 which is exposed at the under portion of the sealing member 16 is called as a second electrode take out portion 14a.

The organic functional layers 13 include a hole transport layer, a light emitting layer, an electron transport layer and a cathode buffer layer (electron injection layer). It may be provided with a gas barrier layer (not illustrated in the figure) between the first electrode (anode) 12 and the flexible substrate 11.

It may be provided with a discontinuous portion 17 at a portion of the first electrode (anode) 12 so that it may intersect at right angle with a conveying direction of the material. When a plurality of organic EL elements are formed on the continuously formed the first electrode 12 (anode) and they are cut to separate into an individual organic EL element, a portion of the anode will be exposed at the cutting side. It may produce short-circuit. By considering the concern of short-circuit, it is preferable to form a discontinuous portion 17 so that it may separate the exposed first electrode (anode).

Although the layer composition of the organic EL element shown in these figure shows an example, the following compositions are cited as examples of other typical layer compositions between the first electrode (anode) and the second electrode.

(1) First electrode (anode)/light emitting layer/second electrode (cathode)
(2) First electrode (anode)/light emitting layer/electron transport layer/second electrode (cathode)
(3) First electrode (anode)/hole transport layer/light emitting layer/hole blocking layer/electron transport layer/second electrode (cathode)
(4) First electrode (anode)/hole transport layer (hole injection layer)/light emitting layer/hole blocking layer/electron transport layer/cathode buffer layer (electron injection layer)/second electrode (cathode)
(5) First electrode (anode)/anode buffer layer (hole injection layer)/hole transport layer/light emitting layer/hole blocking layer/electron transport layer/cathode buffer layer (electron injection layer)/second electrode (cathode)

Each layer composing the organic EL element will be described later.

Figure 2:
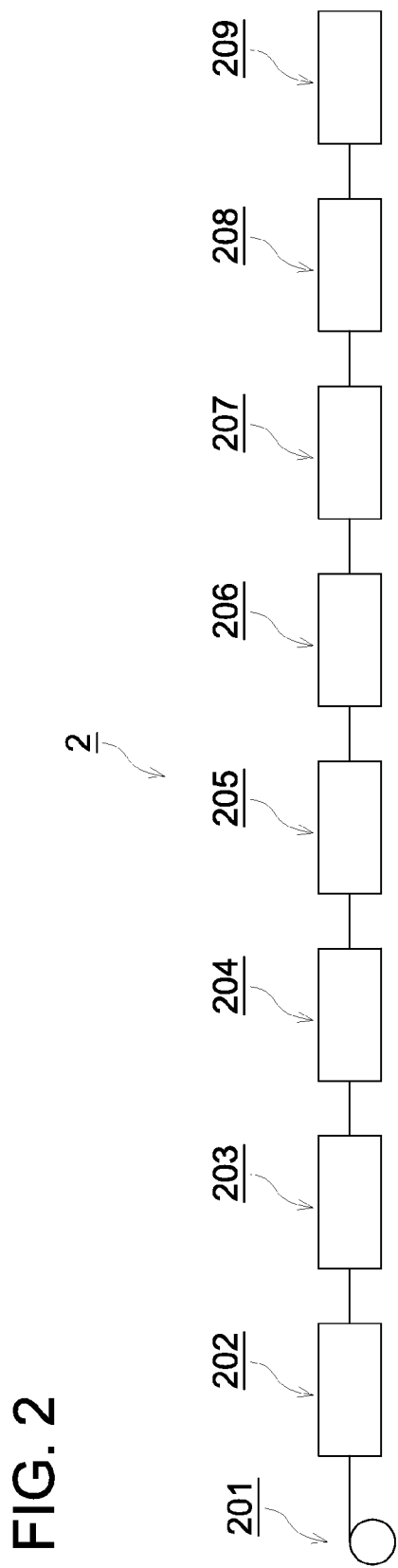
FIG. 2 is a schematic drawing to show an example of a production process to produce an organic EL element shown in FIG. 1 using a belt form flexible substrate with a roll-to-roll method.

FIG. 2 is a schematic drawing to show an example of a production process to produce an organic EL element shown in FIG. 1 using a belt form flexible substrate with a roll-to-roll method.

In the figure, 2 indicates a production process of an organic EL element. The production process 2 include the following: a belt form flexible substrate supplying process 201; a first electrode forming process 202; a hole transport layer forming process 203; a light emitting layer forming process 204; an electron transport layer forming process 205; a cathode buffer layer (electron injection layer) forming process 206; a second electrode forming process 207; a sealing process 208; and a recovery process 209. Here, as a recovery process 209, it may use a cutting device to obtain a separated organic EL element from the belt form flexible substrate having the plurality of organic EL elements thereon, and it may use a winding device to wind in a roll the belt form flexible substrate having the plurality of organic EL elements thereon. When a winding device is used, after rolling round in the shape of a roll to recover, it may cut into a separated organic EL element from the belt form flexible substrate having the plurality of organic EL elements thereon which have been produce in another process.

A roll-to-roll method is a method to produce an organic El element by using a belt form flexible substrate wound in a roll as illustrated in the figure, followed by going through a first electrode forming process 202 to a sealing process 208.

Here, this figure shows the case where all of the supplying process 201 to the recovery process 209 are continuously performed. However, when the whole manufacturing process becomes long and installation becomes difficult, a manufacturing process may be divided suitably, the belt form flexible substrate may be wound in a roll to keep once, and then, the belt form flexible substrate may be supplied into a subsequent process in a roll again. Each manufacturing process will be described by referring to FIG. 3 to FIG. 6.

FIG. 3 is a schematic drawing to show from the supplying step till a first electrode forming step illustrated in FIG. 2.

In the figure, 201 indicates a supplying process of a belt form flexible substrate, and 202 indicates a first electrode forming process. In the supplying process 201, it is employed a delivery device (not illustrated in the figure) which unrolls the belt form flexible substrate wound in a roll 3a. The belt form flexible substrate 3 is continuously unrolled to the subsequent first electrode forming process 202 through a transport roller 201b. In addition, to the belt form flexible substrate is attached an alignment mark (not illustrated in the figure) used for positioning of patterning of organic functional layers including such as a hole transport layer mentioned later.

The first electrode forming process 202 uses a first electrode forming device 202a, a first accumulator 202b, a second accumulator 202c, a first electrode cutting device 202d1, a third accumulator 202d and a winding device 202e. The first electrode forming device 202a contains a vacuum deposition device 201a1 having a vapor source container 202a2. Here, in the case of inventions relating to claim 1 or 2, the first electrode cutting device 202d1 is not used (the detail will be described later).

The first accumulator 202b contains a plurality of transport rollers 202b1 located at underside and a plurality of transport rollers 202b2 located at upper side. It is provided in order to adjust the speed of the supplying process 201 and the first electrode forming device 202a. The second accumulator 202c and the third accumulator 202d each have a plurality of transport rollers 202c1 and 202d2 located at underside and a plurality of transport rollers 202c2 and 202d3 located at upper side. They are provided in order to adjust the speed of the first electrode cutting device 202d1, the first electrode forming device 202a and the winding device 202e.

In the first electrode forming process 202, a first electrode is formed as a film with a first electrode forming device 202a on a belt form flexible substrate 3 which is continuously supplied from the supplying process 201. The thickness of the first electrode is preferably 100 nm to 200 nm. When the first electrode of the plurality of organic EL elements are formed on the belt form flexible substrate 3, it is preferable that the first electrode is continuously formed without an opening in the conveying direction (flowing direction of the coating) of the belt form flexible substrate 3. After formation of the first electrode, it is preferable that the belt form flexible substrate which has been laminated with the first electrode is wound temporarily with a winding device 202e through a transport roller 202e1 to keep provisionally. After keeping provisionally, it is supplied to a hole transport layer forming process 203 (refer to FIG. 4). In addition, when it is not wound and not kept, it is continuously sent to the hole transport layer forming process 203.

The supplying process 201 and the first electrode forming process 202 are preferably performed under a vacuum condition. Here, in the present figure, although it is illustrated the case in which the first electrode forming process is done with a vacuum deposition method, it is not limited in particular, and other method such as a sputtering method can be used.

FIG. 4 is a schematic drawing to show a hole transfer layer forming step illustrated in FIG. 2.

The hole transport layer forming process 203 contains a sending out section 203a, a coating section 203b, a drying section 203c, a pattern forming section 203d, an accumulator 203e and a winding section 203f. In the hole transport layer forming process 203, a coating solution for forming the hole transport layer is coated on the whole surface of the first electrode of the belt form flexible substrate which has been formed with the first electrode. After formation of the hole transport layer (not illustrated in the figure, it corresponds to the hole transport layer 103 in FIG. 1) by passing through the drying section 203c, patterning is performed in the pattern forming section 203d setting apart the upper portion of the taking out electrode of the first electrode and the hole transport layer around the first electrode. After completion of the patterning of the hole transport layer, it is possible to wind the material temporarily to keep it provisionally. Moreover, it may be continuously transferred to the light emitting layer forming process 204 (refer to FIG. 2). The hole transport layer forming process 203 is installed in an atmospheric condition.

In the sending out section 203a, the belt form flexible substrate 3a which has been formed with the first electrode and wound around a winding core is sent through a transport roller 203a1. It is possible to install an accumulator 203a2 and a charge preventing means 203a3 between the sending out section 203a and the coating section 203b according to the necessity. The accumulator 203a2 contains a plurality of transport rollers 203a21 located at underside and a plurality of transport rollers 203a22 located at upper side. They are provided in order to adjust the speed in the coating section 203b. The charge preventing means 203a3 contains a non-contact type charge preventing device 203a31 and a contact type charge preventing device 203a32. As an example of a non-contact type charge preventing device 203a31, it is cited a non-contact type ionizer. The kind of an ionizer is not limited in particular. The ion generating mode may be either an AC mode or a DC mode. Although it can be uses an AC type, a double DC type, a pulse AC type and a soft X-ray type, an AC type is preferably used from the viewpoint of precise discharge performance. With respect to the jetting gas necessary for employing an AC type, air or $N_2$ can be used. However, a sufficiently pure $N_2$ is preferably used. From the viewpoint of conducting under the condition of in-line, the ionizer is selected from a blower type or from a gun type.

As a contact type charge preventing device 203a32, a discharge roller or a conductive brush which is grounded can be used. The discharge roller used as a discharger is grounded, and surface charge will be eliminated by contacting to the surface to be discharged with a free rotation. As such discharge roller, it can be used a metal roller made of aluminium, copper, nickel, and stainless steel, in addition, it can be used a elastic plastic roller or a rubber roller which is made by mixing with carbon black, a metal powder, or a metal fiber therein. Especially, an elastic roller is preferable in order to improve the contact with the belt form flexible substrate 3a. As a conductive brush which is grounded, it can be generally cited a brush member composed of a conductive fiber arranged in a line, and a discharge bar or a discharge filament structure having a line shaped metal brush. Although there is no limitation to the kind of a discharge bar, it is preferable to use a corona discharge mode. For example, SJ-B made by KEYENCE Corporation is used. With respect to a discharge filament, although there is no limitation to the kind thereof, it is preferable to use a filament of a flexible structure. For example, 12/300×3 made by NASLON Co., Ltd. Can be cited.

The non-contact type charge preventing device 203a31 is preferably used at the side of the hole transport layer which has been formed on the belt form flexible substrate 3a. The contact type charge preventing device 203a32 is preferably used at the rear side of the belt form flexible substrate 3a.

The coating section 203b uses a wet coating device 203b1 and a back up roller 203b2 which holds the belt form flexible substrate 3 which has been formed the first electrode (anode) thereon. A coating solution for forming a hole transport layer is coated on the whole surface of the belt form flexible substrate which has been formed with the first electrode. The thickness of the hole transport layer is about 5 nm to 5 μm, and preferably, it is 5 to 200 nm.

In addition, the present figure illustrates the case of using a die coating method (extrusion coating method) of a whole coating type as a wet coating device. However, it is possible to use a whole coating type which coats the whole surface including the first electrode and a slit coating type which does not coat on the upper portion of the taking out electrode of the first electrode. In the case of using a slit coating type, a pattern forming section 203d is not needed, therefore it is preferable.

The drying section 203c contains a drying device 203c1 and a heat treatment device 203c2. It is designed to heat the hole transport layer from the rear side of the belt form flexible substrate 3a with a rear side heat transfer method. The preferred heating condition of the hole transport layer by heat the treatment device 203c2 is to heat at the temperature of −30 to +30° C. with respect to the glass transition temperature of the hole transport layer by considering the improved flatness of the hole transport layer, removal of the remaining solvent and curing of the hole transport layer. Further, it is preferable to heat with a rear side heat transfer method at a temperature not exceeding the decomposition temperature of the organic compounds constituting the hole transport layer.

The pattern forming section 203d contains a wiping device 203d1.

The wiping device 203d1 contains an alignment mark detector (not illustrated in the figure) to detect an alignment mark (not illustrated in the figure) on the belt form flexible substrate 3a which has been formed with the hole transport layer.

In order to remove the hole transport layer located on the upper portion of the taking out electrode of the first electrode, the wiping device 203d1 will remove by wiping the hole transport layer located on the upper portion of the taking out electrode of the first electrode with a member which is impregnated with a solvent which dissolves the hole transport layer (good solvent) based on the information of the alignment mark detector (not illustrated in the figure). Although it is not limited in particular with respect to the wiping removal method of the organic functional layer with a member impregnated with a solvent (good solvent), it can use a method as described in, for example, JP-A No. 2007-515756. Further, a removal method of an organic functional layer is not limited to this.

As a solvent which dissolves the hole transport layer (good solvent), it is not limited in particular as long as it can dissolve the hole transport material which forms the hole transport layer. For example, when the hole transport material which forms the hole transport layer is poly(ethylenedioxythiophene) (PEDOT:PSS), it can be cited water and isopropanol.

The accumulator 203e contains a plurality of transport rollers 203e1 located at underside and a plurality of transport rollers 203e2 located at upper side. They are provided in order to adjust the speed of the pattern forming section 203d and the winding section 203f.

Here, the light emitting layer forming process 204 (refer to FIG. 2) and the electron transport layer forming process 205 (refer to FIG. 2) each have the same composition as the hole transport layer forming process 203 illustrated in FIG. 4. Therefore, the detailed description to them is omitted. The outline of the light emitting layer formation and the electron transport layer formation will be described.

In the light emitting layer forming process 204 (refer to FIG. 2), a coating solution for forming the light emitting layer is coated with a wet coating device on the whole surface of the belt form flexible substrate 3 which has been formed with the patterned hole transport layer. As a wet coating device, it can be used a wet coating device of the same mode used for coating the coating solution for forming the hole transport layer. The light emitting layer is formed by subjecting to drying and heating treatment through the drying section. Then, it is detected an alignment mark (not illustrated in the figure) given to the belt form flexible substrate 3 by a solvent coating device with an alignment mark detector (not illustrated in the figure). Then, the light emitting layer is removed by wiping with a member which is impregnated with a solvent which dissolves the light emitting layer (good solvent) in accordance with the patterned hole transport layer based on the information of the alignment mark detector (not illustrated in the figure).

As for a used solvent (good solvent), it is not limited in particular as long as it can dissolve the materials which compose the light emitting layer. For example, when the materials which compose the light emitting layer are a dicarbazole derivative (CBP) for a host material and an iridium complex (Ir $(ppy)_3$) for a dopant material, it can be cited, toluene, anisole and cyclohexanone.

In the electron transport layer forming process 205 (refer to FIG. 2), a coating solution for forming the electron transport layer is coated with a wet coating device on the whole surface of the belt form flexible substrate 3 which has been formed with the patterned light emitting layer. As a wet coating device, it can be used a wet coating device of the same mode used for coating the coating solution for forming the hole transport layer. The electron transport layer is formed by subjecting to drying and heating treatment through the drying section. Then, it is detected an alignment mark (not illustrated in the figure) given to the belt form flexible substrate 3 with an alignment mark detector (not illustrated in the figure). Then, the electron transport layer is removed by wiping with a member which is impregnated with a solvent which dissolves the electron transport layer (good solvent) in accordance with the patterned light emitting layer based on the information of the alignment mark detector (not illustrated in the figure).

As for a used solvent (good solvent), it is not limited in particular as long as it can dissolve the material which composes the electron transport layer. For example, when the material which composes the electron transport layer is 2-(4-biphenyl)-5-(p-tert-butyl phenyl)-1,3,4-oxadiazole (t-Bu-PBD), ethyl lactate can be cited as a solvent.

Figure 5:
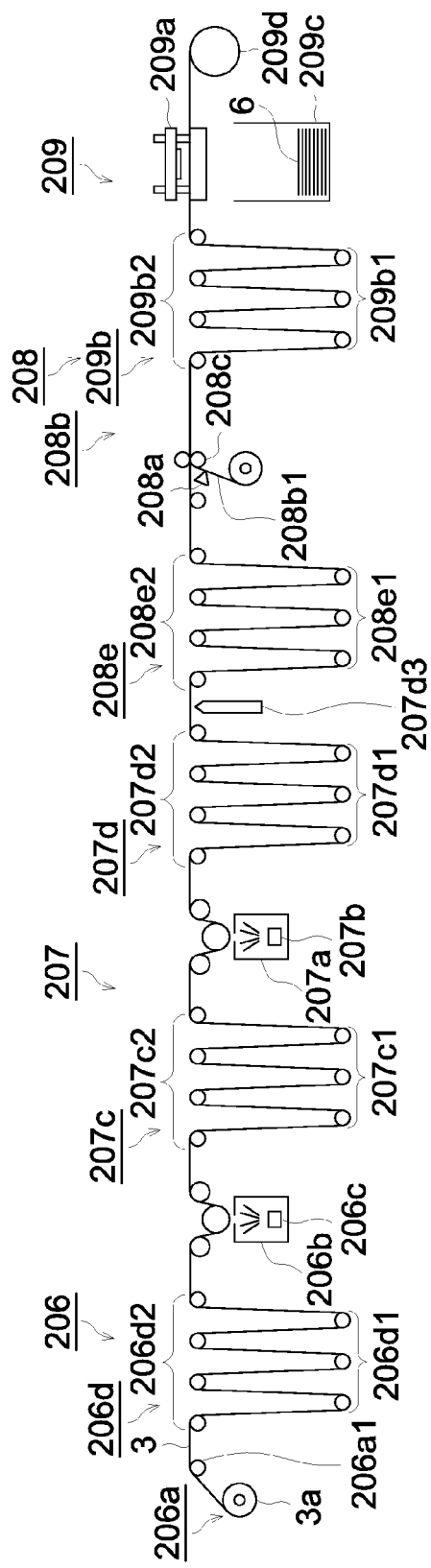
FIG. 5 is a schematic drawing to show the steps after a cathode buffer layer (an electron injection layer) forming step illustrated in FIG. 2.

FIG. 5 is a schematic drawing to show the steps after a cathode buffer layer (an electron injection layer) forming step illustrated in FIG. 2. Herein, in the present figure, a cutting device is used in a recovery process, and the present figure shows the case in which it is used a belt form flexible substrate 3 having been formed with an electron transport layer.

The cathode buffer layer (electron injection layer) forming process 206 contains: a sending out section 206a of the belt form flexible substrate 3a having been formed with an electron transport layer and wound in a roll, and it uses a vacuum deposition device 206b having a vapor source container 206c and an accumulator 206d. The accumulator 206d contains a plurality of transport rollers 206d1 located at underside and a plurality of transport rollers 206d2 located at upper side. It is installed between the sending out section 206a and the vacuum deposition device 206b. It is provided in order to adjust the speed of the sending out section 206a and the vacuum deposition device 206b.

In the cathode buffer layer (electron injection layer) forming process 206, it is detected an alignment mark (not illustrated in the figure) given to the belt form flexible substrate 3 having been formed with an electron transport layer (not illustrated in the figure, it corresponds to the electron transport layer 105 in FIG. 1) with an alignment mark detector (not illustrated in the figure), which is continuously supplied from the sending out section 206a through a transport roller 206a1. Then, to the determined position based on the information of the alignment mark detector (not illustrated in the figure) except on the position of the taking out electrode, it is formed a cathode buffer layer (electron injection layer) (not illustrated in the figure, it corresponds to the electron injection layer 107 in FIG. 1) in a mask patterning with a vapor deposition device 206b on the electron transport layer already formed. The thickness of the cathode buffer layer (electron injection layer) is preferably in the range of 0.1 nm to 5 μm.

The second electrode forming process 207 uses: a vacuum deposition device 207a having a vapor source container 207b; and an accumulator 207c. The accumulator 207c contains a plurality of transport rollers 207c1 located at underside and a plurality of transport rollers 207c2 located at upper side. It is installed between the cathode buffer layer (electron injection layer) forming process 206 and the second electrode forming process 207. It is provided in order to adjust the speed of the cathode buffer layer (electron injection layer) forming process 206 and the second electrode forming process 207.

In the second electrode forming process 207, it is detected an alignment mark (not illustrated in the figure) given to the belt form flexible substrate 3 having been formed with the cathode buffer layer (electron injection layer) with an alignment mark detector (not illustrated in the figure), which is continuously supplied from the cathode buffer layer (electron injection layer) forming process 206. Then, to the determined position based on the information of the alignment mark detector (not illustrated in the figure), it is formed a second electrode (not illustrated in the figure, it corresponds to the second electrode (cathode) 14 in FIG. 1) having a taking out electrode (not illustrated in the figure, it corresponds to the taking out electrode 12a in FIG. 1) in a mask patterning with a vapor deposition device 207a on the cathode buffer layer (electron injection layer) already formed (not illustrated in the figure, it corresponds to the cathode buffer layer (electron injection layer) 106 in FIG. 1). The sheet resistance of the second electrode (cathode) is preferably a few hundred Ω/□ or less, and the thickness is preferably 10 nm to 5 μm, more preferably it is selected in the range of 50 to 200 nm. In this stage, it is produced an organic EL element having a composition of: substrate/first electrode (anode)/hole transport layer/light emitting layer/cathode buffer layer (electron injection layer)/second electrode (cathode).

In the case of the invention described in claim 2, the first electrode is cut to form a discontinuous portion (not illustrated in the figure) in first electrode in accordance with the alignment given to the belt form flexible substrate 3 with a first electrode cutting device 207d3 in a first electrode discontinuous portion forming process 207d. As a method for cutting, it can be cited, for example, a laser cutting of the first electrode, however, it is not limited.

Although the formation of a discontinued portion is not limited to the second electrode forming process 7, by considering the effect caused by the discontinuity of the first electrode (anode) to the coating, it is preferable that the formation of a discontinued portion is done during the moment of after completion of the coating section 203b (refer to FIG. 4) and before the formation of the sealing member in the sealing process 208 (refer to FIG. 5).

The accumulator 207d and the accumulator 208e each have a plurality of transport rollers 207d1 and 208e1 located at underside and a plurality of transport rollers 207d2 and 208e2 located at upper side. They are provided in order to adjust the speed of a first electrode cutting device 207d3, the vacuum evaporation device 207a and the second electrode (cathode) forming process 207.

The present figure shows the case in which a cathode buffer layer (electron injection layer) forming process 206 and a second electrode forming process 207 use a vacuum deposition device. However, the forming method of a cathode buffer layer (electron injection layer) and a second electrode is not limited in particular, and there can be used the following dry processes: a sputtering method, a reactive-sputtering method, a molecular beam epitaxy method, a cluster ion beam method, a ion plating method, a plasma polymerizing method, an atmospheric pressure plasma polymerizing method, a plasma CVD method, a laser CVD method, and a heat CVD method.

Further, a cathode buffer layer (electron injection layer) can be formed using a wet coating method.

The sealing process 208 contains a sealing member supplying process 208b, and it uses a sealing agent coating device 208a and an accumulator 208e. A sealing member 208b1 is sent from the sealing member supplying process 208b.

In addition, it is also given an alignment mark (not illustrated in the figure) to the sealing member 208b1 at the same position as the alignment mark (not illustrated in the figure) given to the belt form flexible substrate 3a having been formed with the second electrode.

In the sealing process 208, it is detected an alignment mark (not illustrated in the figure) given to the belt form flexible substrate 3a having been formed with the second electrode with an alignment mark detector (not illustrated in the figure). Then, the sealing member is coated with the sealing agent coating device 208a to the upper side and the circumference of the organic EL element except on the position of the taking out electrode (not illustrated in the figure, it corresponds to the taking out electrode 12a and the taking out electrode 14a in FIG. 1) based on the information of the alignment mark detector (not illustrated in the figure).

Thereafter, the organic EL element is sealed closely using a pasting device 208c by adjusting the alignment mark (not illustrated in the figure) given to the belt form flexible substrate 3a formed with a plurality of organic EL elements and having been coated with the coating agent and the alignment mark (not illustrated in the figure) given to the sealing member 208b1. In this stage, organic EL elements are produced. Since the plurality of the organic EL elements produced in this stage are continuously bonded with each other, they are cut to separate into an individual organic EL element in the recovery process 209.

The recovery process 209 uses a cutting device 209a, an accumulator 209b and a recovery container 209c. The accumulator 209c contains a plurality of transport rollers 209b1 located at underside and a plurality of transport rollers 209b2 located at upper side. It is provided in order to adjust the speed of the sealing process 208 and the recovery process 209. In the cutting device 209a, it is detected an alignment mark (not illustrated in the figure) given to the belt form flexible substrate 3 having been formed with a plurality of organic EL elements and an alignment mark (not illustrated in the figure) given to the sealing member 208b1 with an alignment mark detector (not illustrated in the figure). Then, press-cutting is carried out based on the information of the alignment mark detector (not illustrated in the figure) to recover separated organic EL elements in the recovery container 209c. 209d indicates a skeleton wound in a roll after press-cutting the organic EL elements. The press-cut organic EL elements 6 each have the same composition as the organic EL element illustrated in FIG. 1.

Figure 6:
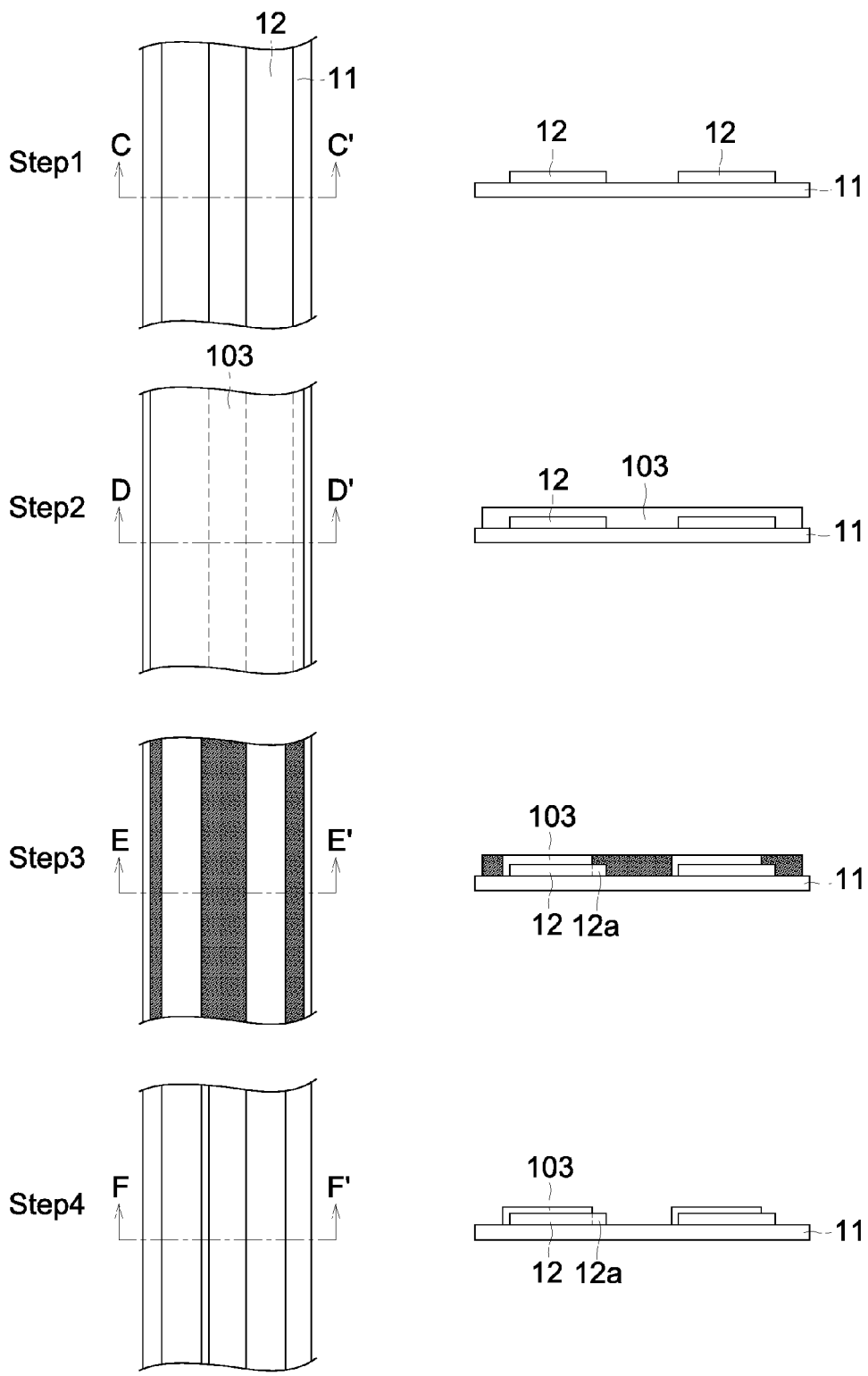
FIG. 6 is a schematic flow chart which shows the pattering of the hole transport layer in the hole transfer layer forming step illustrated in FIG. 4.

FIG. 6 is a schematic flow chart which shows the pattering of the hole transport layer in the hole transfer layer forming step illustrated in FIG. 4 relating to the invention of claims 1 and 2. Hereafter, it will be described pattering of the hole transport layer formed by coated on the whole surface of the belt form flexible substrate having been formed with a first electrode (anode).

Step 1 indicates a belt form flexible substrate 11 on which is formed a continuous first electrode (anode) 12 in a first electrode forming process 202 (refer to FIG. 2). The right side is a schematic cross-section view along the line C-C' illustrated in Step 1.

Step 2 indicates a belt form flexible substrate 11 on which is formed a hole transport layer 103 in a hole transport layer forming process 203 (refer to FIG. 2). The hole transport layer is formed on the whole surface of the belt form flexible substrate including on the upper position of the first electrode (anode) 12, except on the both edges of the substrate. The right side is a schematic cross-section view along the line D-D' illustrated in Step 2.

Step 3 indicates a situation in which the hole transport layer 103 is removed by wiping (the slashed portion in the figure) with a member which is impregnated with a solvent (good solvent) enabling to dissolve the hole transport layer 103 located on the upper position of the taking out electrode of the first electrode (anode) with a wiping device 203d1 in a pattern forming section 203 (refer to FIG. 4). The right side is a schematic cross-section view along the line E-E' illustrated in Step 3.

Step 4 indicates a situation in which the hole transport layer 103 located on the taking out electrode 12a of the first electrode (anode) 12 is removed by wiping with a wiping device 203d1 in a pattern forming section 203 (refer to FIG. 4). When Step 4 is completed, the taking out electrode 12a of the first electrode (anode) 12 will become in an exposed condition. The right side is a schematic cross-section view along the line F-F' illustrated in Step 4.

After that, a light emitting layer is formed on the hole transport layer 5 according to the flow of Step 1 to Step 4. An electron transport layer also is formed on the light emitting layer according to the flow of Step 1 to Step 4.

In addition, although the invention in claim 3 will not be described by referring to a figure, a discontinuous portion of the first electrode is produced in the continuous first electrode with a first electrode cutting device 202d1 installed between the second accumulator 202c and the third accumulator 202d in the above-described FIG. 3. By using the first electrode (anode) 12a having a discontinuous portion in the first electrode which has been formed in Step 1, and thereafter Step 2 and subsequent steps will be performed. That is, in each Step, the first electrode has a discontinuous portion.

In the roll-to-roll production method illustrated in FIG. 2 to FIG. 6, the first electrode is formed continuously instead of subjected to pattering. It was found the effect that the coating films became stable without being affected by the deformation in the conveying direction (coating direction) of the belt form flexible substrate or by the step difference.

Hereinafter, it will be described the materials which constitute an organic EL element cited as an example of the production method of the functional thin film of the present invention.

(Belt Form Flexible Substrate)

A resin film can be cited as a belt form flexible substrate. Examples of a resin film include: polyesters (e.g., polyethylene terephthalate (PET), polyethylenenaphthalate (PEN)), polyethylene, polypropylene, cellophane, cellulose esters or those derivatives (e,g., cellulose di acetate, cellulose triacetate, cellulose acetate butyrate, cellulose acetate propionate (CAP), cellulose acetate phthalate (TAC), cellulose nitrate), polyvinylidene chloride, polyvinyl alcohol, polyethylene vinyl alcohol, syndiotactic polystyrene, polycarbonate, norbornene resin, polymethyl pentene, polyether ketone, polyimide, polyether sulfone (PES), polyphenylene sulfide, polysulfones, polyetherimide, polyether ketone imide, polyamide, fluororesin, nylon, polymethylmethacrylate, acrylic resins, polyarylates, and cycloolefin resins (e.g., ARTON (trade name made by JSR) and APEL (trade name made by Mitsui Chemicals, Inc).

A gas barrier film is appropriately formed on the surface of a resin film utilized according to necessity. A gas barrier film includes film of an inorganic substance, an organic substance or hybrid film of the both. As the characteristic of gas barrier film, a water vapor permeability is preferably not more than 0.01 g/m$^2$/day. Further, a film having a high barrier capability of an oxygen permeability of not more than 0.1 ml/m$^2$/day·MPa and a water vapor permeability of not more than $10^{-5}$ g/m$^2$/day is preferable.

As a material to form a barrier film, a material provided with a function to restrain invasion of such as moisture and oxygen, which may induce deterioration of an element, is preferable and such as silicon oxide, silicon dioxide and silicon nitride can be utilized. Further, to overcome brittleness of said film, it is more preferable to provide an accumulation structure comprising an inorganic layer and a layer comprising an organic material. The order of accumulation of an inorganic layer and an organic layer is not specifically limited; however, it is preferable to alternately accumulate the both in plural times. A forming method of barrier film is not specifically limited, and such as a vacuum evaporation method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method and a coating method can be utilized, however, an atmospheric pressure plasma polymerization method such as described in JP-A 2004-68143 is specifically preferable.

(First Electrode (Anode))

As an anode according, preferably utilized are those comprising a metal, an alloy, a conductive compound and a mixture thereof which has a large work function (4 eV or more).

Specific examples of such an electrode substance include a conductive transparent material such as metal like Au, CuI, indium tin oxide (ITO), SnO$_2$ and ZnO. Further, a material such as IDIXO (In$_2$O$_3$—ZnO), which can prepare an amorphous and transparent electrode, may be also utilized. It is also possible to use a material which can be coated such as an organic electric conductive compound. As for a first electrode (anode), these electrode substances may be made into a thin layer by a method such as evaporation or spattering and a pattern of a desired form may be formed by means of photolithography, or in the case of requirement of pattern precision is not so severe (about 100 μm or more), a pattern may be formed through a mask of a desired form at the time of evaporation or spattering of the above-described substance. When emission is taken out of this anode, the transmittance is preferably set to be set larger than 10% and the sheet resistance as a first electrode (anode) is preferably a few hundred Ω/□ or less. Further, although the layer thickness depends on a material, it is generally selected in a range of 10 nm to 1,000 nm and preferably selected in the range of 10 nm to 200 nm.

(Hole Injection Layer (Anode Buffer Layer))

A hole injection layer (an anode buffer layer) is appropriately provided between a first electrode and a light emitting layer or a hole transfer layer. An hole injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)". An anode buffer layer (a hole injection layer) is also detailed in such as JP-A 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polyaniline (emeraldine) and polythiophene.

(Hole Transport Layer)

A hole transport layer contains a material having a function of transporting a hole, and in a broad meaning, a hole injection layer and an electron blocking layer are also included in a hole transport layer. A single layer of or plural layers of a hole transport layer may be provided. A hole transport material is those having any one of a property to inject or transport a hole or a barrier property to an electron, and may be either an organic substance or an inorganic substance. For example, listed are a triazole derivative, an oxadiazole derivative, an imidazole derivative, a polyarylalkane derivative, a pyrazolone derivative, a phenylenediamine derivative, a allylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a hole transport material, those described above can be utilized, however, it is preferable to utilized a porphyrin compound, an aromatic tertiary amine compound and a styrylamine compound, and specifically preferably an aromatic tertiary amine compound. Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-metyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quarterphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4',4"-tris[N-(3-methylphenyl)-N-phenylamino]triphenylamine (MDTDATA), in which three of triphenylamine units are bonded in a star burst form, described in JP-A No. 4-308688.

Polymer materials, in which these materials are introduced in a polymer chain or constitute the main chain of polymer, can be also utilized. Further, an inorganic compound such as a p type-Si and a p type-SiC can be utilized as a hole injection material and a hole transport material.

It can be used a so-called p type hole transport material described in JP-A No. 11-251067 and J. Huang et al., Applied Physics Letters 80 (2002), p. 139. It is preferable to use these compounds in the present invention because they enable to give an emission element with a high emitting efficiency.

The layer thickness of a hole transport layer is not specifically limited, however, it is generally about 5 nm to 5 μm, and preferably 5 to 200 nm. This hole transport layer may have a single layer structure composed of one or not less than two types of the above described materials. Further, an impurity-doped hole transport layer exhibiting high p-characteristics may be used. Examples thereof include those described in JP-A Nos. 4-297076, 2000-196140, and 2001-102175, as well as J. Appl. Phys., 95, 5773 (2004). A hole transport layer exhibiting high p-characteristics is preferably used to produce a low-power-consuming organic EL element (Light Emitting Layer)

A light emitting layer refers to a blue light emitting layer, green light emitting layer, and red light emitting layer. As an order of layers in laminating the light emitting layers, there is no restriction in particular and it may be included an interlayer of non-light emitting between each light emitting layer. In the present invention, it is preferable that at least one blue light emitting layer is located in the position nearest to an anode among all of the light emitting layers. Moreover, when it is provided with four or more light emitting layers, it is preferable to laminate a blue light emitting layer, green light emitting layer, and red light emitting layer in following order in order to improve luminance stability, for example, from the order near to the anode: blue light emitting layer/green light emitting layer/red light emitting layer/blue light emitting layer; blue light emitting layer/green light emitting layer/red light emitting layer/blue light emitting layer/green light emitting layer; and blue light emitting layer/green light emitting layer/red light emitting layer/blue light emitting layer/green light emitting layer/red light emitting layer. Production of a white element is possible by making a light emitting layer into a multilayer.

A light emitting layer contains at least three or more layers each having a different emitting spectrum which shows a luminescence maximum wave length in the range of 430 nm to 480 nm, 510 nm to 550 nm, and 600 nm to 640 nm, respectively. If it has three or more layers, there will be no restriction in particular. When it has four layers or more, it may have a two or more layers showing the same emitting spectrum with each other. The layer is called as a blue light emitting layer when the luminescence maximum wave length is in the range of 430 nm to 480; the layer is called as a green light emitting layer when the luminescence maximum wave length is in the range of 510 nm to 550 nm; and the layer is called as a red light emitting layer when the luminescence maximum wave length is in the range of 600 nm to 640 nm. Moreover, in the extent of maintaining the above-mentioned maximum wave lengths, it may be mixed with two or more luminescent compounds to each light emitting layer. For example, it may be used by mixing the blue luminescence compound having a maximum wave length of 430 nm to 480 nm, and the green luminescence compound having a maximum wave length of 510 nm to 550 nm of maximum wave length for a blue light emitting layer.

There is no limitation in particular to the materials used in the light emitting layer. It can be cited compounds described in pages 228 to 332 of "The newest trend of Flat panel display: The current status and the newest technology trend of EL display" (published by TPRAY Research Center, Co., Ltd.) In order to increase luminous efficiency of a light emitting layer, it is preferable to incorporated in a light emitting layer a well-known host material and a well-known dopant material (phosphorescence compound (it is also called as a phosphorescence luminescence compound)).

A host material refers to a compound contained in an emission layer in an amount of 20 weight % or more and exhibiting a phosphorescence quantum yield of less than 0.1 during phosphorescence emission at room temperature (25° C.). More preferably, the phosphorescence quantum yield of the host compound is less than 0.01. It may be used together plural of host materials. It is possible to control the transfer of charges by making use of a plurality of host compounds, which results in high efficiency of an organic EL element. In addition, it is possible to mix a different emission lights by making use of a plurality of light emitting dopants. White luminescence is possible by adjusting the type of dopant material, and doped quantity, and application to illumination and to backlight can also be achieved.

(Host Materials)

Host materials which may be used are preferably compounds having a hole transporting ability and an electron transporting ability, as well as preventing elongation of an emission wavelength and having a high Tg (a glass transition temperature). Specific examples of a host compound known in the art are described in the documents listed below: for example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, No. 2002-141173, 2002-352957, 2002-203683, 2002-363227, 2002-231453, 2003-3165, No. 2002-234888, 2003-27048, 2002-255934, 2002-260861, 2002-280183, 2002-299060, 2002-302516, 2002-305083, 2002-305084, 2002-308837, 2007-59119, 2007-251096, and 2007-250501.

When there are plural light emitting, layers, it is preferable that each layer contains the same host compound in an amount of 50 mass % or more of the host compounds from the viewpoint of obtaining a uniform film property. Further, it is preferable that the phosphorescence luminescence energy of the host compound is 2.9 eV or more in order to effectively prevent the energy transfer from the dopant material and to obtain high luminance. The term "phosphorescence emission energy" means a peak energy of a 0-0 band in phosphorescence emission obtained by measuring the photoluminescence of a host compound film vapor deposited with 100 nm thickness on a substrate.

As for a host material, it is preferable that the phosphorescence luminescence energy is 2.9 eV or more, and Tg is 90° C. or more in consideration of the deterioration of an organic EL element with time (lowering luminance, membrane property deterioration) and the market needs as a light source. That is, in order to satisfy both luminance and fade resistance, it is preferable that phosphorescence luminescence energy is 2.9 eV or more, and Tg is 90° C. or more. Further, it is preferable that Tg is 100° C. or more.

(Dopant Materials)

A dopant material (a phosphorescence compound or a phosphorescence-emitting compound) is a compound from which emission from an excited triplet state is observed, and a compound which emits phosphorescence at room temperature (25° C.) and exhibiting a phosphorescence quantum yield of 0.01 or more at 25° C. By combining with a host material as described above, it can achieve an organic EL element exhibiting a high light emitting efficiency.

A phosphorescence quantum yield of a dopant material (a phosphorescence compound or a phosphorescence-emitting compound) is preferably 0.1 or more. The phosphorescence quantum yield can be determined via a method described in page 398 of Bunko II of Dai 4 Han Jikken Kagaku Koza 7 (Spectroscopy II of 4th Edition Lecture of Experimental Chemistry 7) (1992, published by Maruzen Co., Ltd.). The phosphorescence quantum yield in a solution can be determined using various kinds of appropriate solvents. However, it is only necessary for the phosphorescent compound of the present invention to exhibit the above phosphorescence quantum yield using any of the appropriate solvents.

There are cited two kinds of principles regarding emission from a dopant material. One is an energy transfer-type, wherein carriers recombine on a host material on which the carriers are transferred to produce an excited state of the host material, and then via transfer of this energy to a dopant material, emission from the dopant material is realized. The other is a carrier trap-type, wherein a dopant material serves as a carrier trap and then carriers recombine on the dopant material to generate emission from the phosphorescence-emitting compound. In each case, the excited state energy of the dopant material is required to be lower than that of the host material.

Regarding to the dopant material, there may be employed any appropriate compound selected from those known in the art used in a light emitting layer incorporating in an organic EL element. A preferably used dopant material in the present invention is a complex compound containing, as the central metal, a metal of the 8th-10th groups of the periodic table of the elements, and it is more preferably an iridium compound (an Ir complex), an osmium compound, a platinum compound (a platinum complex compound), or a rare earth complex. Of these, an iridium compound is most preferable.

The maximum phosphorescence wavelength of the dopant material is not limited in particular, and the obtained emission light wavelength can be varied by selecting the central metal, the ligand and the substituent on the ligand.

The color of emission light of the materials used in the organic EL element invention is measured via a spectroradiometer CS-1000 (manufactured by Konica Minolta Sensing Inc.) and the measured values are plotted onto the CIE chromaticity diagram described in FIG. 4.16 on page 108 of "Shinpen Shikisai Kagaku Handbook" (Coloring Science Handbook, New Edition), (edited by Nihon Shikisai Gakkai, published by Todai Shuppan Kai, 1985), whereby the color is determined.

The term of "white element" means that the chromaticity is within a region of X=0.33±0.07, Y=0.33±0.1 according to CIE 1931 color coordinate system at 1,000 cd/m² when a front luminance at a viewing angle of 2 degrees is measured via the above method.

The light emitting layer formed by drying is a layer in which are recombined an electron and a hole are recombined being injected from the electrode, the electron injection layer and the hole transport layer. The portion of emitting ling may be inside of the light emitting layer, or may be an interface between the light emitting layer and the adjacent layers.

(Electron Transport Layer)

An electron transfer layer is composed of a material having a function to transfer an electron, and an electron injection layer and a hole blocking layer are included in an electron transfer layer in a broad meaning. A single layer or plural layers of an electron transfer layer may be provided.

In the past, when a mono or plural electron transport layers are arranged in the position nearer to the cathode with respect to an emission layer, an electron transfer material (also used as a hole blocking material) in an electron transport layer is required to have a function to transport an electron injected from a cathode to an emission layer. The compounds conventionally well known in the art can be utilized by arbitrarily selection as a material thereof. Examples thereof include such as a nitro-substituted fluorene derivative, a diphenylquinone derivative, a thiopyradineoxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material. Polymer materials, in which these materials are introduced in a polymer chain or these materials form the main chain of polymer, can be also utilized. Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol) aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material. Further, metal-free or metal phthalocyanine, or those whose terminal is substituted by an alkyl group and a sulfonic acid group, can be preferably utilized as an electron transfer material. Further, distyrylpyrazine derivative, which has been exemplified as a material of an emission layer, can be also utilized as an electron transfer material, and, similarly to the case of a hole injection layer and a hole transfer layer, an inorganic semiconductor such as an n-type-Si and an n-type-SiC can be also utilized as an electron transfer material.

The layer thickness of an electron transport layer is not specifically limited; however, it is generally about 5 nm to 5 μm, and preferably it is 5 nm to 200 nm. The electron transport layer may have a single layer structure composed of one or plural types of the above described materials.

(Cathode Buffer Layer (Electron Injection Layer))

A cathode buffer layer (electron injection layer) is composed of a material having a function to transfer an electron, and it is included in an electron transfer layer in a broad meaning. A cathode buffer layer (electron injection layer) is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)". A cathode buffer layer (an electron injection layer) is also detailed in such as JP-A 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide. The above-described buffer layer (injection layer) is preferably a very thin layer, and the layer thickness is preferably in a range of 0.1 nm to 5 μm, although it depends on a raw material.

The above described electron transport layer is provided in the position of the light emitting layer side adjacent to the cathode buffer layer. Further, an impurity-doped electron transport layer exhibiting high n-characteristics may be used. Examples thereof include those described in JP-A Nos. 4-297076, 10-270172, 2000-196140, and 2001-102175, as well as J. Appl. Phys., 95, 5773 (2004). An electron transport layer exhibiting high n-characteristics as described above is preferably used to produce a low-power-consuming element (Second Electrode (Cathode))

As a cathode, it can be used, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. As for a cathode, these electrode substances may be made into a thin layer by a method such as evaporation or spattering. The sheet resistance as a cathode is preferably a few hundred $\Omega/\square$ or less and the layer thickness is generally selected in the range of 10 nm to 5 μm and preferably in the range of 50 nm to 200 nm. Herein, to transmit emission, either one of a first electrode (anode) or a second electrode (cathode) of an organic EL element is preferably transparent or translucent to improve the emission luminance Further, a transparent or a translucent second electrode (cathode) can be made by applying a transparent conductive material after providing the above-described metal on the second electrode (cathode) in a thickness of 1 to 20 nm which. The transparent conductive materials are described in the section for the first electrode (anode). By applying these materials, it can be made an element having both an anode and a cathode provided with a property of transparent (Sealing Agents (Adhesives))

A liquid sealing agent and a thermoplastic resin are cited as a sealing agent. Specific examples of a liquid sealing agent include: photocurable and thermocurable type adhesives having a reactive vinyl group of acrylic acid oligomers and methacrylic acid oligomers; moisture curable type adhesives such as 2-cyanoacrylic acid ester; thermal and chemical curing type (two blended liquids) adhesives such as an epoxy adhesive are also included; and cationically curable type and ultraviolet ray curable type epoxy resin sealing agent. It is preferable to add a filler to a liquid sealing agent if needed. An amount of an added filler is preferably 5 to 70 volume %. Moreover, as for the size of the filler to be added, in consideration of adhesive strength and the sealing agent thickness after bonded by pressure, it is preferable to be 1 μm to 100 μm. There is no limitation in particular as a type of filler to add, for example, there are cited: soda glass, alkali free glass or silica; and metal oxides such as titanium dioxide, antimony oxide, titania, alumina, zirconia and tungsten oxide.

It is preferable a thermoplastic resin which has a melt flow rate of 5 to 20 g/10 min based on a method regulated in JIS K 7210, more preferably, it is a thermoplastic resin having a melt flow rate of 6 to 15 g/10 min or less as a thermoplastic resin. If a resin having a melt flow rate below 5 (g/10 min) is used, it cannot this completely bury the space portion produced with the step difference of the taking out electrode of each electrode. And if a resin having a melt flow rate over 20 (g/10 min) is used, it will result in decreasing a tensile strength, a stress-proof cracking nature and workability. It is preferable that these thermoplastic resins are formed in the shape of a film, and to use by adhering to a flexible sealing member (a belt form flexible sealing member and a sheet form flexible sealing member). It is possible to use the generally known various ways as an adhering method, for example, it can apply: a wet laminating method, a dry laminating method, a hot melt laminating method, an extrusion laminating method, and a heat laminating method.

Although the thermoplastic resins are not limited in particular if they satisfy the above-mentioned numerical value, it is preferable to use polymers described in "New development of functional wrapping materials" (Toray Research Center, CO., Ltd)): low density polyethylene (LDPE), HDPE, linear low density polyethylene (LLDPE), middle density polyethylene, un-stretched polypropylene (CPP), OPP, ONy, PET, cellophane, polyvinyl alcohol (PVA), stretched vinylon (OV), ethylene-vinyl acetate copolymer (EVOH), ethylene-propylene copolymer, ethylene-acrylate copolymer, ethylene-methacrylate copolymer, and vinylidene chloride (PVDC). Among these thermoplastic resins, it is preferable to use thermoplastic resins of LDPE, LLDPE and LDPE and LLDPE; LDPE and LLDPE which are manufactured using a metallocene catalyst; and thermoplastic resins produced by mixing LLDPE, LLDPE and HDPE film.

(Flexible Sealing Member)

As a flexible sealing member, it can be cited the materials which are produced by forming a barrier layer on a base support made of flexible resin films, such as polyethylene terephthalate and nylon, with a vapor-depositing method or a coating method, or it can be cited materials using the metallic foil as a barrier layer. Examples of the barrier layers are made of metals such as In, Sn, Pb, Au, Cu, Ag, Al, Ti, Ni; and metal oxides such as MgO, SiO, SiO2, $Al_2O_3$, GeO, NiO, CaO, BaO, $Fe_2O_3$, $Y_2O_3$, and $TiO_2$. Moreover, as a materials for metal foils, although it can be used metal materials, such as aluminum, copper and nickel; and alloy materials, such as stainless steel and an aluminium alloy, an aluminum is preferable in respect of workability or cost. The film thickness is about 1 to 100 μm, and it is preferably about 10 μm to 50 μm. Moreover, in order to make easy the handling at the time of production, it may laminate films, such as a polyethylene terephthalate film and a nylon film, beforehand. When a resin film is used for a flexible sealing member, it is preferable to have a thermoplastic adhesion property resin layer on the side in contact with a liquid sealing agent.

A water vapor transmissivity of a flexible sealing member is preferable to be 0.01 $g/m^2$-day or less, and an oxygen transmissivity thereof is preferably 0.1 $ml/m^2$-day·MPa. The water vapor transmissivity is the value measured mainly by the MOCON method based on the JIS K7129B method (1992), and the oxygen transmissivity is the value measured mainly by the MOCON method based on the JIS K7126B method (1987). The Young's modulus of a flexible sealing member is preferably $1\times10^{-3}$ GPa to 80 GPa, and the thickness is preferably 10 μm to 500 μm, in consideration of close adhesion of a flexible sealing member with the 1st sticking-by-pressure component and the 2nd sticking-by-pressure component and spread prevention of the sealing agent.

As for the external extraction efficiency at room temperature of luminescence of the organic EL element produce by the functional thin film forming method of the present invention, it is preferably 1% or more, and more preferably it is 5% or more. The external extraction efficiency is defined as follows:

External extraction efficiency(%)=[(Number of photons emitted to the outside of organic EL element)/(Number of electrons injected into organic EL element)]×100.

Moreover, it may be used together a color improvement filter such as a color filter, or it may be used together a color conversion filter which changes the emission color from an organic EL element into multiple colors using a phosphor. When using a color conversion filter, it is preferable that the luminescence of an organic EL element has $\lambda_{max}$ of 480 nm or less.

In order to increase the extraction efficiency of the light generated in the light emitting layer, it is preferable to combine the following methods in the organic EL element produced by the functional thin film forming method of the present invention. It is commonly stated that the organic EL element emits light in a layer exhibiting a higher refractive index (being about 1.7 to about 2.1) than that of air, whereby only about 15 to 20% of light emitted in the light emitting layer can be taken out The reasons for the above are as follows: the light incoming to the interface (the interface between the transparent substrate and air) at angle θ which is greater than the critical angle is totally reflected, whereby no light is taken out to the exterior of the element; and the light is totally reflected between the transparent electrode or the light emitting layer and the transparent substrate so that the light is waveguided through the transparent electrode or the light emitting layer, and as a result the light escapes to the side direction of the element.

As a means to increase the light extraction efficiency include, there are known the following, for example: a method in which irregularity is formed on the surface of the transparent substrate so that total reflection at the interface between the transparent substrate and air is minimized (U.S. Pat. No. 4,774,435); a method in which efficiency is enhanced by allowing the substrate to exhibit light focusing properties (JP-A No. 63-314795); a method in which a reflective surface is formed on the side of the element (JP-A No. 1-220394); a method in which a flat layer exhibiting an intermediate refractive index is introduced between the substrate and the light emitting body, whereby an reflection inhibiting film is formed (JP-A No. 62-172691); a method in which a flat layer exhibiting a refractive index lower than that of the substrate is introduced between the above substrate and the light emitting body (JP-A No. 2001-202827); and a method in which a diffraction grating is arranged between any layers of the substrate, the transparent electrode layer and the light emitting layer (including between the substrate and the exterior) (JP-A No. 11-283751).

When it is produced an organic EL element by the functional thin film forming method of the present invention, there may be suitably employed the method to introduce a flat layer exhibiting a lower refractive index than that of the substrate between the above substrate and the light emitting layer, or the method to arrange a diffraction grating between any layers of the substrate, the transparent electrode layer and the light emitting layer (including between the substrate and the exterior).

When a medium exhibiting a low refractive index is formed at a thickness greater than the wavelength of light between the transparent electrode and the transparent substrate, the lower the refractive index of the medium, the higher the efficiency of extraction of the light, emitted from the transparent electrode, to the outside. Examples of the medium of the low refractive index layer include aerogel, porous silica, magnesium fluoride, and fluorine based polymers. Since the refractive index of the transparent substrate is commonly about 1.5 to 1.7, the refractive index of the above low refractive index layer is preferably 1.5 or less, and more preferably at 1.35 or less. The thickness of the low refractive index medium is preferably at least twice the wavelength in the medium. The reason is that when the thickness of the low refractive index medium is about light wavelength so that electromagnetic wave leaked out via evernescent enters into the substrate, effects of the low refractive index layer are reduced. A method to introduce a diffraction grating at the interface which results in total reflection or into any of the media is characterized in that increased effects of the light extraction efficiency is high.

In the above method, of light generated from the light emitting layer, the light, which is not capable of escaping to the exterior due to total reflection at the boundary between two layers, is diffracted via an introduction of the diffraction grating between any layers or within the medium (in the transparent substrate or the transparent electrode) by utilizing properties of the diffraction grating in which it is possible to change the direction of light to a specified direction differing from diffraction via so-called Bragg diffraction, such as primary diffraction or secondary diffraction, to result in the light being extracted to the outside. It is preferable that the introduced diffraction grating exhibits a two-dimensional periodical refractive index. Since the light emitting layer randomly emits light in all directions, in a general one-dimensional diffraction grating, which exhibits a cyclic refractive index distribution only in a certain direction, only the light directed to a specified direction is diffracted whereby the light extraction efficiency is not so increased. However, by employing the refractive index of a two-dimensional distribution, the light directing to all directions is diffracted to increase the light extraction efficiency.

The location of the diffraction grating may be, as described above, between any layers or in a medium (in a transparent substrate or a transparent electrode), but a position near the organic light emitting layer when light is emitted is preferred. In such a case, the period of the diffraction grating is preferably about half to about 3 times the wavelength of the light in the medium. With regard to the arrangement of the diffraction grating, a two-dimensionally repeating arrangement such as a square lattice shape, a triangle lattice shape, or a honeycomb shape is preferred.

With respect to an organic EL element produced by the functional thin film forming method of the present invention, in order to effectively extract the light generated in the light emitting layer, it is possible to enhance luminance in a specified direction by focusing light to the specified direction such as the front direction with regard to the light emitting surface of the element, which can be achieved by processing the element to, for example, provide a microlens array structure or by combining the element with a so-called light focusing sheet on the light extracting side of the substrate. An example of the above microlens array is that quadrangular pyramids are two-dimensionally arranged on the light extracting side of the substrate in such a manner that one side is 30 μm and the vertex angle is 90 degrees. The side is preferably 10 μm to 100 μm. In the case where the side is shorter than the above length, undesirable diffraction effects occur to result in unwanted coloration, while in the case where the side is excessively long, the thickness undesirably increases.

As the light focusing sheet, it is possible to employ, for example, those which are currently used in LED backlights of liquid crystal display devices. As an example of such a sheet, the luminance enhancing film (BEF), produced by Sumitomo 3M Co., Ltd, may be employed. As the shape of a prism sheet, examples may include a sheet in which a stripe of triangles is formed on the substrate, which stripe exhibits a vertex angle of 90 degrees and a pitch of 50 μm, or may be a sheet exhibiting shapes such as a rounded vertex, randomly varying pitches, and the like. Further, to control the radiation angle of light from the light emitting element, a light diffusion plate/film may be combined with the focusing sheet. For example, the light diffusion film (LIGHT-UP), produced by Kimoto Co., Ltd. may be employed.

EXAMPLES

The specific effects of the present invention will now be described with reference to examples, however, the present invention is not limited thereto.

Example 1

Preparation of Belt Form Flexible Substrate

It was arranged a polyethylene naphthalate film having a thickness of 125 μm, a width of 200 mm and a length of 500 m (made by Teijin-DuPont Films, Co., Ltd. Hereafter, it is abbreviated as PEN). Here, an alignment mark had been give beforehand to the both surfaces of the belt form flexible substrate at the same position.

Formation of First Electrode

By using the device illustrated in FIG. 3, an ITO (indium tin oxide) layer having a thickness of 120 nm was formed under the vacuum condition of $5 \times 10^{-1}$ Pa with a sputtering method to obtain a continuous first electrode and it was wound temporally and was stored for one hour.

Preparation of Hole Transport Layer Forming Coating Solution

A solution was prepared by using poly(3,4-ethylenedioxythiophene)-polystyrene sulfonate (PEDOT/PSS, Baytron P AI 4083 made by Bayer AG.) diluted in water (65%) and methanol (5%) as a hole transport layer forming coating solution. The surface tension of the hole transport layer forming coating solution was measured to be 40 mN/m (with CBVP-A3 made by Kyowa Interface Science, Co., Ltd.)

Formation of Hole Transport Layer

By using an device illustrated in FIG. 4, a PEN film wound in a roll on which was formed with a first electrode was subjected to a discharge treatment Then, the whole surface on the PEN film (except the both edge portions with a width 10 mm) was coated with the hole transport layer forming coating solution with a wet coating method employing an extrusion coater under the following conditions so that the dried thickness became 30 nm. After the coating, the coated layer was dried by heating treatment in the drying section under the following conditions to form a hole transport layer. Here, the conveying rate was set to be 3 m/minute. The conveying rate was measured with a laser Doppler speed indicator LV203 made by Mitsubishi Electric, Co., Ltd.

As a discharge treatment, there were used: a non-contact type charge preventing device on the first electrode forming side; and a contact type charge preventing device on the rear side of the film. A flexible AC type ionizing bar MODEL 4 100V (made by Hugle Electronics, Inc.) was used for a non-contact type charge preventing device. A conductive guide roll ME-102 (made by MIYAKO Roller Industrial Company) was used for a contact type charge preventing device.

Coating Condition:

The coating of the hole transport layer forming coating solution was done under the following coating conditions: the temperature of the hole transport layer forming coating solution at the time of coating was 25° C.; under the atmosphere of a $N_2$ gas having a dew point of −20° C.; and with a cleanness class 5 or less (JIS B 9920).

Drying and Heat Treatment Condition:

Drying and heat treatment conditions of a hole transport layer forming coating solution were as follows. After coating the hole transport layer forming coating solution, it was processed with a drying device and a heat treatment device illustrated in FIG. 4. In the drying device, the solvent is removed by applying air from an exit of a slit nozzle type to the film forming surface at a height of 100 mm, having an air speed of 1 m/s with an air distribution in the width direction of 5%, at a temperature of 120° C. Subsequently, it was processed with a heat treatment device at temperature of 150° C. to carry out heat treatment with a rear side heat transfer method. Thus, a hole transport layer was formed.

Pattering of Hole Transport Layer

According to the flow illustrated in FIG. 6, an alignment mark given to the PEN film was detected, and then, in accordance with the position of the alignment mark, the unnecessary portion of the hole transport layer, which was located above the taking out electrode of the first electrode and around the first electrode, was removed by wiping the hole transport layer with a wiping member impregnated with pure water (which is a good solvent) based on the method described in JP-A No. 2007-515756.

Preparation of Light Emitting Layer Forming Coating Solution

| Dicarbazole derivative | 1.00 mass % |
| Iridium complex (Ir(ppy)$_3$) | 0.05 mass % |
| Toluene | 98.95 mass % |

The surface tension of the prepared light emitting layer forming coating solution was 28 mN/m at 25° C. measured with CBVP-A3 made by Kyowa Interface Science, Co., Ltd.

Formation of Light Emitting Layer

It was carried out a discharge treatment to a PEN film which had been formed with a hole transport layer using the prepared coating solution and wound in a roll. Then, the whole surface on the PEN film (except the both edge portions with a width 10 mm) was coated at 25° C. with the light emitting layer forming coating solution with a wet coating method employing an extrusion coater under the following conditions so that the dried thickness became 50 nm. After the coating, the coated layer was dried by heating treatment in the drying section under the following conditions to form a light emitting layer. Here, the conveying rate was set to be 3 m/minute. The conveying rate was measured with a laser Doppler speed indicator LV203 made by Mitsubishi Electric, Co., Ltd.

As a discharge treatment, there were used: a non-contact type charge preventing device on the hole transport layer side;

and a contact type charge preventing device on the rear side of the film. A flexible AC type ionizing bar MODEL 4 100V (made by Hugle Electronics, Inc.) was used for a non-contact type charge preventing device. A conductive guide roll ME-102 (made by MIYAKO Roller Industrial Company) was used for a contact type charge preventing device.

Coating Condition:

The coating of the light emitting layer was done under the following coating conditions: the temperature of the light emitting layer forming coating solution at the time of coating was 25° C.; under the atmosphere of a $N_2$ gas having a dew point of −20° C.; and with a cleanness class 5 or less (JIS B 9920).

Drying and Heat Treatment Condition:

Drying and heat treatment conditions of a light emitting layer forming coating solution were as follows. After coating the light emitting layer forming coating solution, it was processed with a drying device and a heat treatment device illustrated in FIG. 4, which were the same devices used for drying and heat treatment of the hole transport layer coating film. In the drying device, the solvent is removed by applying air from an exit of a slit nozzle type to the film forming surface at a height of 100 mm, having an air speed of 1 m/s with an air distribution in the width direction of 5%, at a temperature of 60° C. Subsequently, it was processed with a heat treatment device at temperature of 150° C. to carry out heat treatment with a rear side heat transfer method. Thus, a light emitting layer was formed.

Pattering of Light Emitting Layer

According to the flow illustrated in FIG. 6, an alignment mark given to the PEN film was detected, and then, in accordance with the position of the alignment mark, the unnecessary portion of the light emitting layer, which was located above the taking out electrode of the first electrode and around the hole transport layer, was removed by wiping the light emitting layer with a wiping member impregnated with pure water (which is a good solvent) based on the method described in JP-A No. 2007-515756.

Preparation of Electron Transport Layer Forming Coating Solution

| | |
|---|---|
| 2-(4-biphenyl)-5-(p-tert-butyl phenyl)-1,3,4-oxadiazole (t-Bu-PBD) | 1.00 mass % |
| Ethyl lactate | 99 mass % |

The surface tension of the prepared electron transport layer forming coating solution was 29 mN/m at 25° C. measured with CBVP-A3 made by Kyowa Interface Science, Co., Ltd.

Formation of Electron Transport Layer

It was carried out a discharge treatment to a PEN film which had been formed with a light emitting layer using the prepared coating solution and wound in a roll. Then, the whole surface on the PEN film (except the both edge portions with a width 10 mm) was coated at 25° C. with the electron transport layer forming coating solution with a wet coating method employing an extrusion coater under the following conditions so that the dried thickness became 30 nm. After the coating, the coated layer was dried by heating treatment in the drying section under the following conditions to form an electron transport layer. Here, the conveying rate was set to be 3 m/minute. The conveying rate was measured with a laser Doppler speed indicator LV203 made by Mitsubishi Electric, Co., Ltd.

As a discharge treatment, there were used: a non-contact type charge preventing device on the light emitting layer side; and a contact type charge preventing device on the rear side of the film. A flexible AC type ionizing bar MODEL 4 100V (made by Hugle Electronics, Inc.) was used for a non-contact type charge preventing device. A conductive guide roll ME-102 (made by MIYAKO Roller Industrial Company) was used for a contact type charge preventing device.

Coating Condition:

The coating of the electron transport layer was done under the following coating conditions: the temperature of the electron transport layer forming coating solution at the time of coating was 25° C.; under the atmosphere of a $N_2$ gas having a dew point of −20° C.; and with a cleanness class 5 or less (JIS B 9920).

Drying and Heat Treatment Condition:

Drying and heat treatment conditions of an electron transport layer forming coating solution were as follows. After coating the electron transport layer forming coating solution, it was processed with a drying device and a heat treatment device illustrated in FIG. 4, which were the same devices used for drying and heat treatment of the hole transport layer coating film. In the drying device, the solvent is removed by applying air from an exit of a slit nozzle type to the film forming surface at a height of 100 mm, having an air speed of 1 m/s with an air distribution in the width direction of 5%, at a temperature of 150° C. Subsequently, it was processed with a heat treatment device at temperature of 100° C. to carry out heat treatment with a rear side heat transfer method. Thus, an electron transport layer was formed.

Pattering of Light Emitting Layer

According to the flow illustrated in FIG. 6, an alignment mark given to the PEN film was detected, and then, in accordance with the position of the alignment mark, the unnecessary portion of the electron transport layer, which was located above the taking out electrode of the first electrode and around the hole transport layer, was removed by wiping the electron transport layer with a wiping member impregnated with pure water (which is a good solvent) based on the method described in JP-A No. 2007-515756.

Preparation of Organic EL Element

On the electron transport layer were formed a cathode buffer layer (electron injection layer), a second electrode, and a sealing member in this order under the following conditions by using a step illustrated in FIG. 5. Then it was cut to form an organic EL element, and it was called as sample No. 101.

Formation of Cathode Buffer Layer

Electron Injection Layer

An alignment mark given to the PEN film wound in a roll was detected, and then, in accordance with the position of the alignment mark, it was laminated with a cathode buffer layer (electron injection layer) having a thickness of 0.5 nm on the electron transport layer and around the portion except the taking our electrode using a vapor deposition apparatus under the vacuum condition of $5 \times 10^{-4}$ Pa using LiF as a cathode buffer layer (electron injection layer) forming material.

Formation of Second Electrode

The alignment mark given to the PEN film wound in a roll was detected again, and then, on the cathode buffer layer (electron injection layer) which had been formed in accordance with the position of the alignment mark was laminated with a second electrode having a thickness of 100 nm to adjust the size of the first electrode under the vacuum condition of $5\times10^{-4}$ Pa. Aluminium was used as a second electrode forming material, and a taking out electrode was arranged with a vapor deposition method to performing a mask patterning film formation. Thus an organic EL element No. 101 was prepared.

Formation of Electrode Discontinuous Portion

Before the formation of the cathode buffer layer (electron injection layer) in the preparation of the organic EL element No. 101, it was detected the alignment mark given to the PEN film which has been provided with a patterned electron transport layer and wound in a roll. Then, in accordance with the position of the alignment mark, it was formed with a discontinuous portion of the first electrode at a predetermined position by using a YAG laser (the second harmonic wave: wavelength=532 nm) to remove the organic functional layer formed on and above the first electrode in an amount of 0.5 mm width and 4.0 mm width, respectively. In the same manner as preparation of the organic EL element No. 101, an organic EL element No. 102 (0.5 mm) and No. 103 (4.0 mm) were prepared.

Coating of Sealing Agent

The alignment mark given to the PEN film of the prepared organic EL element was detected. Then, in accordance with the position of the alignment mark, a UV curable liquid sealing agent (epoxy resin type) was coated on and around the light emitting area except the edges of the taking out electrode of the first electrode and the second electrode to have a thickness of 30 μm.

Adhesion of Sealing Member

Subsequently, on the surface of the belt form sheet sealing member coated with the sealing agent of the organic EL element was laminated with the organic EL element in the position except the edges of the taking out electrode of the first electrode and the second electrode by using a roll laminator. It was roll pressed with a pressure of 0.1 MPa under an atmospheric pressure, followed by irradiated with a light having a wavelength of 365 nm using a high pressure mercury lamp under irradiation strength of 5 to 20 mW/cm$^2$ with a distance of 5 to 15 mm for one minute to result in curing to adhere. Thus, it was achieved a state in which a plurality of organic EL elements were continuously bonded with each other.

Preparation of Sealing Member

A PET film (made by Teijin-DuPont Films, Co., Ltd.) as a sealing member, and it was prepared a belt form sheet sealing member having a two layer structure provided with an aluminium foil as a barrier layer. The thickness of PET film was 50 μm, and the aluminium foil used as a barrier layer was made to be 30 μm. In addition, the formation of the barrier layer of the PET film was done with a known laminating method.

Cutting

The material having a plurality of organic EL elements continuously bonded with each other was cut in accordance with the position of the alignment mark after detecting the alignment mark given to the PEN film with the size of an individual organic EL element.

Example 2

An organic EL element was prepared in the same manner as used for preparation of an organic EL element in Example 1, except that it was formed a discontinuous portion of the first electrode in the first electrode forming process before coating the layers. The gap of the discontinuous portion was varied to be 1, 2, 3 and 5 mm. The obtained organic EL elements were evaluated according to the evaluation ranks as shown below. The results are listed in Table 1.

Evaluation Way of Emission Unevenness (Luminescence Unevenness)

An organic EL element was impressed with 5 V using a constant voltage power source. The difference of luminescence in six points located in the center area of the emitting surface were visually observed to evaluate.

Evaluation Way of Emission Unevenness (Luminescence Unevenness)

A: There are observed no difference of luminescence.

B: Among six points, the luminescence at one point is different from the luminescence at other points.

C: Among six points, the luminescence at 2 to 4 points is different.

D: Among six points, the luminescence at 4 or more points is different.

TABLE 1

| Sample No. | Gap of discontinuous portion of first electrode at the time of coating (mm) | Emission unevenness | Remarks |
|---|---|---|---|
| 101 | — | A | Invention |
| 102 | — | A | Invention |
| 103 | — | A | Invention |
| 201 | 1 | B | Invention |
| 202 | 2 | C | Invention |
| 203 | 3 | D | Comparison |
| 204 | 5 | D | Comparison |

It was found that Sample No. 102 and No. 103, each having a discontinuous portion which was produced by removing the organic functional layer formed on and above the first electrode after continuously forming the organic functional layer with a coating method, exhibited no effect of emission unevenness. This result was the same as the result of Sample No. 101 which had no discontinuous portion.

It is preferable that the first electrode before coating does not have a gap (step difference) in the conveying direction of the substrate from the viewpoint of achieving stable coating. However, since the effect of emission unevenness is small when the gap of the discontinuous portion in the first electrode is 2 mm or less, more preferably, 1 mm or less, it is possible to make the first electrode to have a discontinuous portion before coating. By forming a discontinuous portion in the first electrode before coating, it become possible to wash it before coating to result in avoiding the concern of the effects (increase of leak electric current and increase of dark spots) of the dust which may be produced when forming the discontinuous portion after coating.

DESCRIPTION OF SYMBOLS

1: Organic EL element
3: Belt form flexible substrate
3a: Belt form flexible substrate wound in a roll
11: Flexible substrate
12: First electrode (anode)
12a: Taking out electrode of the first electrode
13: Organic functional layer
103: Hole transport layer
104: Light emitting layer
105: Electron transport layer
106: Cathode buffer layer (electron injection layer)
14: Second electrode (cathode)
14a: Taking out electrode of the second electrode
15: Sealing agent
16: Sealing member
17: Discontinuous portion
20: Organic EL structure
2: Production process
201: Supplying process
202: First electrode forming process
202a: First electrode forming device
202d1: First electrode cutting device
203: Hole transport layer forming process
203b: Coating section
203c: Drying section
203d: Pattern forming section
203d1: Wiping device
204: Light emitting layer forming process
205: Electron transport layer forming process
206: Cathode buffer layer (electron injection layer) forming process
207: Second electrode forming process
207d3: First electrode cutting device
208: Sealing process
209: Recovery process

What is claimed is:

1. A method for producing an organic EL element which comprises a belt form flexible substrate having thereon a first electrode, at least one organic functional layer, and a second electrode, the method comprising performing, in sequential order, operations of:

continuously forming the at least one organic functional layer with a coating method on the first electrode which has been continuously provided on the belt form flexible substrate in a conveying direction of the belt form flexible substrate;

processing the first electrode with the at least one organic functional layer coated thereon so as to make the first electrode have a discontinuous portion;

forming the second electrode on the formed at least one organic functional layer to produce a structure having a plurality of organic EL elements arranged in the conveying direction of the belt form flexible substrate; and then cutting the plurality of organic EL elements to separate the plurality of organic EL elements into individual organic EL elements.

2. The method for producing an organic EL element of claim 1, wherein the discontinuous portion of the first electrode is formed with a gap of 0.5 mm to 2 mm.

* * * * *